United States Patent [19]

Liu et al.

[11] Patent Number: 5,330,932

[45] Date of Patent: Jul. 19, 1994

[54] METHOD FOR FABRICATING GAINP/GAAS STRUCTURES

[75] Inventors: William U. Liu; Shou-Kong Fan; Timothy S. Henderson, all of Richardson; Darrell G. Hill, Plano, all of Tex.

[73] Assignee: Texas Instruments Incorporated, Dallas, Tex.

[21] Appl. No.: 999,072

[22] Filed: Dec. 31, 1992

[51] Int. Cl.$^5$ ............... H01L 21/20; H01L 21/306
[52] U.S. Cl. ..................... 437/133; 156/643; 437/909; 148/DIG. 11
[58] Field of Search ............ 437/133, 126, 909; 148/DIG. 11, DIG. 72; 156/643

[56] References Cited

U.S. PATENT DOCUMENTS

| | | | |
|---|---|---|---|
| 3,972,770 | 8/1976 | Stein | 156/650 |
| 4,596,069 | 6/1986 | Bayraktaroglu | 437/184 |
| 4,996,166 | 2/1991 | Ohshima | 437/133 |
| 5,077,231 | 12/1991 | Plumton et al. | 437/51 |
| 5,155,738 | 10/1992 | Ijichi et al. | 372/45 |
| 5,194,403 | 3/1993 | Delage et al. | 437/184 |

*Primary Examiner*—R. Bruce Breneman
*Assistant Examiner*—Linda J. Fleck
*Attorney, Agent, or Firm*—Michael K. Skrehot; James C. Kesterson; Donaldson, Richard L.

[57] ABSTRACT

In one form of the invention, a method is disclosed for removing portions of successive layers of GaAs 34 and GaInP 32 comprising the steps of: performing an anisotropic reactive ion etch on the GaAs layer; and performing an isotropic wet etch on the GaInP layer, whereby a mesa formed as a result of the reactive ion etch and the wet etch has substantially vertical sidewalls, and further whereby GaInP/GaAs structures having dimensions of less than approximately 3.0 μm may be fabricated.

24 Claims, 3 Drawing Sheets

METHOD FOR FABRICATING GAINP/GAAS STRUCTURES

FIELD OF THE INVENTION

This invention generally relates to methods for fabricating GaInP/GaAs structures.

BACKGROUND OF THE INVENTION

The GaInP/GaAs heterostructure has been shown to exhibit advantages in certain semiconductor devices. One example is the GaInP/GaAs heterojunction bipolar transistor (I-IBT). The GaInP/GaAs heterostructure provides essentially the same bandgap energy difference as the more traditional AlGaAs/GaAs structure, but with more of the discontinuity in the valence band and less in the conduction band. This leads to an advantage in the HBT of providing higher electron injection efficiency than is typically found in AlGaAs/GaAs HBTs. HBTs based on the GaInP/GaAs material system have been shown to have near-ideal current-voltage (i-v) characteristics with constant current gain over five decades of collector current and greater than unity current gain at ultra-small current densities. In additional contrast to AlGaAs/GaAs HBTs, GaInP/GaAs HBTs offer a near unity ideality factor in i-v characteristics, a favorable lineup of the conduction band in the heterojunction, and the relative absence of recombination centers in the emitter.

SUMMARY OF THE INVENTION

Prior art methods of fabricating GaInP/GaAs mesa transistors have relied exclusively on wet etch techniques. Because these techniques are isotropic in nature and therefore etch underneath the edge of an etch mask as well as into the semiconductor structure, the minimum geometries for devices fabricated with the GaInP/GaAs heterostructure have been relatively large (greater than approximately 3 $\mu$m). In contrast, the inventive methods described herein utilize a combination of dry and wet etch techniques to take advantage of the anisotropic etch profile of the dry etch, while retaining the excellent selectivity of certain wet etches in the GaInP/GaAs structure to provide the capability of forming GaInP/GaAs structures having dimensions less than approximately 3 $\mu$m. The process is complicated by the formation of a stubborn residual layer on the GaInP surface when exposed to certain chemicals used in the dry etch process. The methods described herein overcome this limitation in various ways.

In one form of the invention, a method is disclosed for removing portions of successive layers of GaAs and GaInP comprising the steps of: performing an anisotropic reactive ion etch on the GaAs layer; and performing an isotropic wet etch on the GaInP layer, whereby a mesa formed as a result of the reactive ion etch and the wet etch has substantially vertical sidewalls, and further whereby GaInP/GaAs structures having dimensions of less than approximately 3.0 [2m may be fabricated.

In another form of the invention, a method for forming a heterojunction bipolar transistor is disclosed comprising the steps of: forming a material structure, the material structure comprising a GaAs emitter cap layer, a GaInP emitter layer, a base layer, a collector layer, and a subcollector layer; depositing patterned metallization above the emitter cap layer to form an emitter contact; performing an anisotropic reactive ion etch on the emitter cap layer to remove portions of the material structure not covered by the patterned metallization; performing an isotropic wet etch to remove the GaInP layer from the portions of the material structure not covered by the patterned metallization to form an emitter mesa and to expose the base layer; depositing base contacts on the base layer; etching the base layer from an area surrounding the emitter mesa to form a base mesa; etching through the collector layer to the subcollector layer; and depositing collector contacts on the subcollector layer.

In still another form of the invention, a semiconductor device is disclosed comprising a mesa comprising a layer of GaInP and a layer of GaAs on top of the layer of GaInP, the mesa having a width or length of less than approximately 3.0 $\mu$m.

An advantage of the invention is that it allows for the use of dry and wet etch processes on the GaInP/GaAs heterostructure. This makes the fabrication of devices having geometries of less than approximately 3 $\mu$m possible.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

The processing of semiconductor wafers usually requires that selected portions of the wafer be removed so that devices and circuitry may be formed. One of the most common methods of removing, or etching, semiconductor material is "wet" etching. This technique is conceptually simple, usually requiring inexpensive reagents and equipment. The technique is suited to large batch processing, because often the wafers are merely dipped into a solution containing the reagent. However, a drawback to the wet etching technique is that it is an isotropic etch; that is, it etches at generally the same rate in all directions. This limits the minimum dimension of a feature because of the undercutting that is inherent in isotropic etching. Thus, to achieve sub-micron features, such as gates in FETs, or even sub-3.0 micron emitters in HBTs, a wet etch technique alone is inadequate.

Etching techniques which overcome the limitations of isotropic etches are known generally as dry etches. These include reactive ion etching, ion milling, ion bombardment, sputtering, etc. These techniques are all plasma etches, in that they involve an ionized plasma formed by applying a radio-frequency electric field to a gas held at a low pressure in a vacuum chamber. In the ion bombardment, ion milling, and sputtering techniques, the primary mechanism of material removal is the breaking of chemical bonds due to ionic impact. The process is not very selective between differing material types. Conversely, reactive ion etching utilizes a reactive speeds in its plasma that react with the semiconductive material to form products that volatize away from the film surface, or in some cases form residues. The technique also relies on the energetic impact of ions on the semiconductor surface for material removal, but much less so than with the aforementioned dry etch techniques. Indeed, it is the directionality of the impact of the ions on the semiconductor surface that promotes a larger vertical that lateral etch rate. The dry etches are therefore much more anisotropic than the wet etches.

Figure 1:
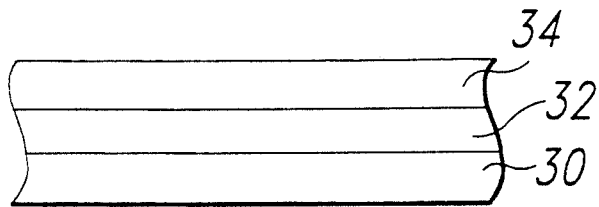
FIGS. 1-5 are a cross-sectional views of a material structure at various stages in a first preferred embodiment process.
Figure 2:
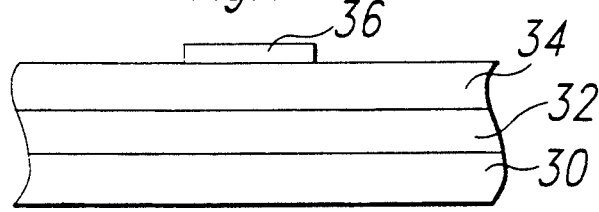

A first preferred embodiment process of the invention begins with the structure shown in FIG. 1. An epitaxial layer 32 of $Ga_xIn_{1-x}P$, wherein x is in the range of approximately 0.48 to 0.53, is interposed between layers of GaAs, 30 and 34. A masking pattern 36 of a suitable material (e.g. Ti/Pt/Au in respective thicknesses of 300/250/3000 Angstroms, for example) is deposited on GaAs layer 34, as shown in FIG. 2. The entire structure is then placed in the reaction chamber of a Reactive Ion Etching (RIE) apparatus. With $BCl_3+SF_6$, $CCl_4$, or other commonly used chlorofuorocarbons as the reactant, GaAs layer 34 is anisotropically dry-etched from areas not covered by masking pattern 36. The etch is allowed to continue for approximately 1 minute after the GaInP layer 32 is exposed.

Figure 3:
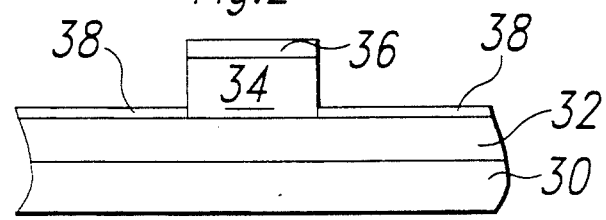

It has been discovered that the GaInP unexpectedly is not etched because a residual layer of unknown composition 38, shown in FIG. 3, forms at the surface of GaInP layer 32. Thus, $BCl_3$ is an etchant that selectively etches GaAs, but not GaInP. Unfortunately, the residual layer 38 is not easily etched using the compositions known to wet etch GaInP, particularly HCl and $HCl:H_3PO_4$ (3:1 by volume).

Figure 4:
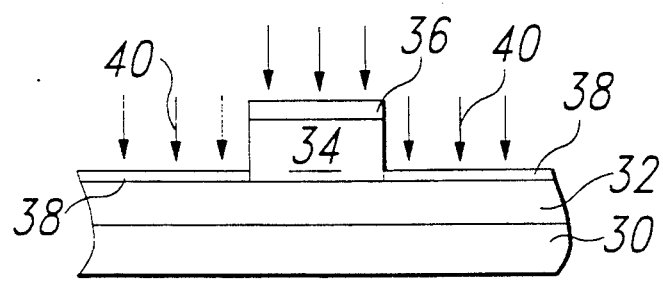
Figure 5:
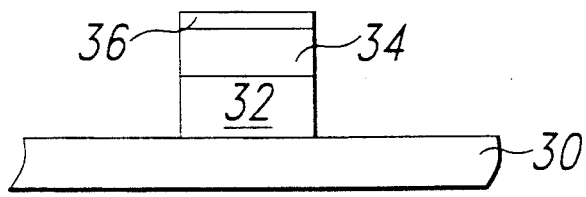

Thus, the $BCl_3$ apparently reacts with the GaInP to form a composition which is not readily etchable by either normal GaInP wet etchants or by the normal GaAs dry etchant. Therefore, in this embodiment the residual layer 38 is ion milled by placing the structure in an asher at approximately 300 Watts for approximately 10 minutes. $O_2$ and Ar 40 form the active species for the milling, depicted in FIG. 4. One can also use a commercially available ion mill apparatus. Immediately after ion milling, the structure is immersed in a solution containing HF and $NH_4F$ for approximately 1 minute. The structure is then immersed in a solution of $H_2SO_4:H_2O_2:H_2O$ (1:8:160 by volume) for 10 seconds. This prepares the GaInP for removal with an HCl solution. The structure is then immersed in static (unstirred) HCl for 5 seconds, and then immersed in a stirred HCl solution for approximately 1 minute intervals. After each interval two probes are placed on the etched surface to test for breakdown voltage. The process typically requires two 1 minute intervals to etch through the GaInP and results in a structure as shown in FIG. 5. Thus this process combines the anisotropic, yet selective, reactive ion etching technique with the unselective ion milling and wet etch techniques. This allows the formation of a structure having a smaller size than would be possible with a wet etch alone.

Figure 6:
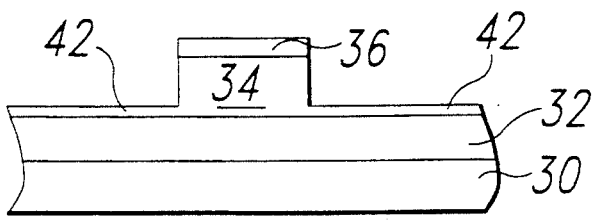
FIGS. 6 and 7 are cross-sectional views of a material structure at two stages in a second preferred embodiment process.
Figure 7:
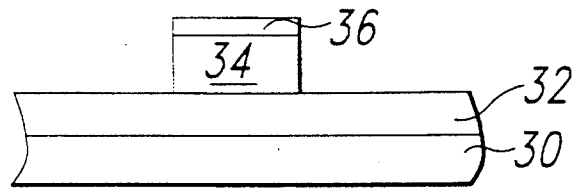

In a second preferred embodiment process, the structure of FIG. 2 is again etched using the RIE technique described above, but the etch is stopped before GaAs layer 34 is completely etched away. This leaves a thin layer 42 of GaAs, as shown in FIG. 6 (instead of forming the residual layer 38 of FIG. 3). This thin layer of GaAs is removed using a solution of $H_2SO_4:H_2O_2:H_2O$ (1:8:160 by volume). The $H_2SO_4$ solution stops on the GaInP layer 32, leaving the structure shown in FIG. 7.

Figure 9:
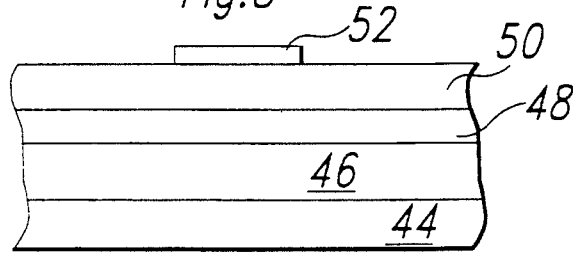
Figure 10:
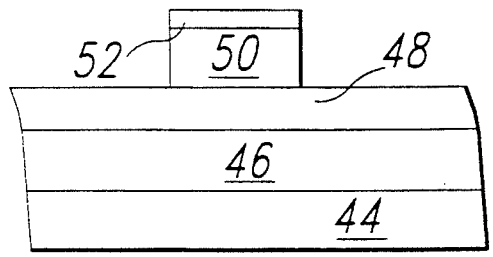
Figure 11:
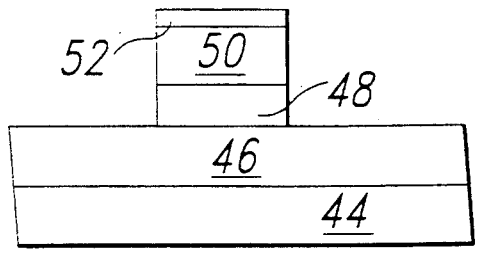
Figure 12:
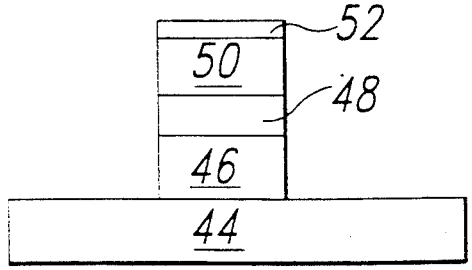

In another preferred embodiment process of the invention, the material structure is altered from that described with reference to the first embodiment to the structure shown in FIG. 8. An $Al_xGa_{1-x}As$ (where x is approximately 0.3) layer 48 is interposed between GaInP layer 46 and GaAs layer 50. The AlGaAs layer serves as an etch stop in that the $BCl_3$ dry etch described in the abovementioned embodiments, when combined with $SF_6$, for example, stops on AlGaAs. Hence, after deposition of a masking pattern 52, shown in FIG. 9, the dry $BCl_3$ etch is performed until GaAs layer 50 is removed. This results in the structure of FIG. 10. AlGaAs layer 48 is removed with a solution of $H_2SO_4:H_2O_2:H_2O$ (1:8:160 by volume) for example, in a timed etch. This leaves the structure shown in FIG. 11. GaInP layer 46 is then removed with $HCl:H_3PO_4$ (3:1 by volume) for example. Though 3:1 does not appreciably etch the GaAs base layer 44, the timing in this etch is monitored to avoid substantial undercutting. The structure shown in FIG. 12 results from this process.

Figure 13:
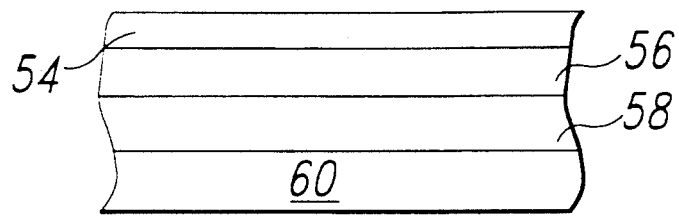
FIG. 13 is a modification of the material structure used in the first preferred embodiment process.

Yet another preferred embodiment process, shown in FIG. 13, is similar to the first except that InGaAs layer 54 is deposited (by MBE, MOCVD, or other suitable technique) on GaAs layer 56. The InGaAs layer 54 facilitates the formation of an ohmic contact to the material structure, but otherwise may be formed with the process described as the first preferred embodiment.

Figure 14:
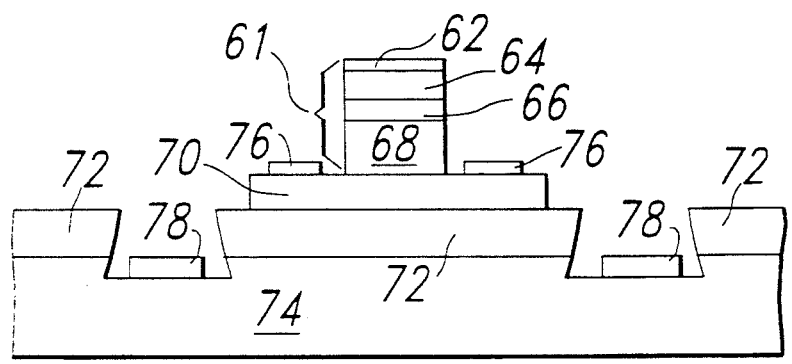
FIG. 14 is a cross-sectional view of a first heterojunction bipolar transistor.

In still another preferred embodiment, the processes described above may be used to fabricate a heterojunction bipolar transistor having an emitter mesa similar to the structure shown in FIG. 13. Unlike prior art HBTs having GaInP emitters, this preferred embodiment HBT may be fabricated with an emitter mesa having a width of less than approximately 3.0 $\mu$m. This is made possible by the embodiment processes describes above. This transistor, shown, in FIG. 14, includes an emitter mesa 61 which comprises an emitter layer 68, a buffer layer 66, and an emitter cap layer 64 which facilitates the formation of an ohmic contact for emitter contact layer 62. In addition to the emitter mesa, the HBT includes a base layer 70 (contact thereto being made by base contacts 76), a collector layer 72, and a subcollector layer 74 (contact thereto being made by collector contacts 78). Preferred materials and examples of possible alternatives are listed in Table I. Preferred dopants, doping concentrations, and examples of alternatives are listed in Table II. It should be noted that a spacer layer may be interposed between the base 70 and emitter 68 layers.

Figure 8:
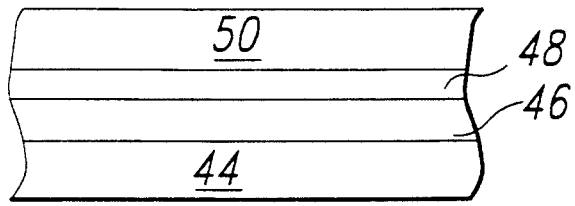
FIGS. 8-12 are cross-sectional views of a material structure at various stages in another preferred embodiment process.
Figure 15:
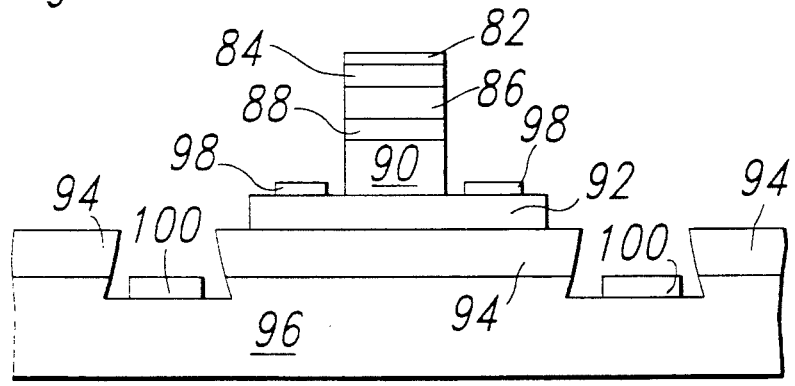
FIG. 15 is a cross-sectional view of a second heterojunction bipolar transistor.

A heterojunction bipolar transistor may also be formed having an emitter mesa similar to the structure shown in FIG. 8. This transistor, shown in FIG. 15, includes an emitter mesa 80 which comprises an emitter layer 90, an etch stop layer 88, a buffer layer 86, an emitter cap layer 84, and an emitter contact layer 82. In addition to the emitter mesa, the HBT includes a base layer 92 (contact thereto being made by base contacts 98), a collector layer 94, and a subcollector layer 96 (contact thereto being made by collector contacts 100). Preferred materials and examples of possible alternatives are listed in Table III. Preferred dopants, doping concentrations, and alternatives are listed in Table IV. Again, it should be noted that a spacer layer may be interposed between the base 92 and emitter 90 layers.

It may be appreciated that a wide bandgap material, such as GaInP, could be appropriate for use in the collector layer of the structures described above to form a double heterojunction bipolar transistor (DHBT). That is, a transistor having a heterojunction at both the base-emitter junction and base-collector junction. This type of structure possesses the additional advantage of high emitter-collector breakdown voltage, which allows for higher power operation than does a single heterojunction transistor.

Figure 16:
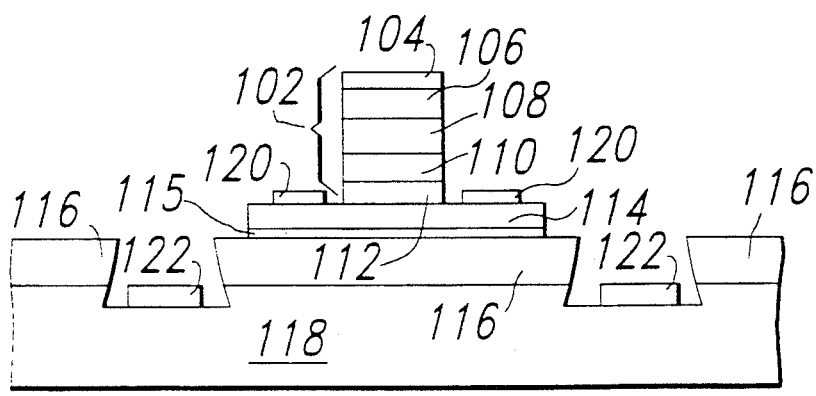
FIG. 16 is a cross-sectional view of a third heterojunction bipolar transistor.

The fabrication of the DHBT begins with an epitaxial structure which comprises an emitter cap layer 106, a buffer 108, an active emitter layer 110, a spacer layer 112, a base layer 114 (contact thereto being made by base contacts 120), a set-back layer 115, a collector layer 116 (contact thereto being made by collector contacts 122), and a subcollector layer 118. The spacer layer 112 was placed between the base 114 and the emitter 110 layers to neutralize the adverse effects of Be outdiffusion due to heavy base doping. From various experiments, the thickness and doping of the base-emitter spacer layer 112 are chosen to achieve the highest current gain. The set-back layer 115 is critical in minimizing the effective barrier for carriers transporting from the base to the collector. Other structures grown under similar conditions without such a set-back layer exhibited a high saturation voltage of approximately 15 Volts and negligible current gain. Preferred materials and examples of possible alternatives are listed in Table V. Preferred dopants, doping concentrations, and alternatives are listed in Table VI. The formation of the DHBT, particularly the emitter mesa 102 is accomplished using techniques described herein. The base 120 and collector 122 contacts are deposited using well known techniques. The DHBT structure is shown in FIG. 16.

The HBT and DHBT structures described above can be grown by MOCVD in a load-locked, horizontal, low pressure reactor at about 76 Torr. Timethylgallium and trimethylindium can be used for the Group-III sources with 100% arsine and phosphine as the Group-V sources. The n-type and p-type dopants can be disilane and carbon tetrachloride, respectively. The substrate is typically oriented (100) 2° off toward the nearest (110) and maintained at nominally 680° C. C for the entire GaInP/GaAs growth. The growth conditions for all layers are generally the same as for a standard AlGaAs/GaAs structure with the exception of the GaInP layer substituting for the AlGaAs. Growth can be interrupted for several seconds at each interface, but no optimization is typically performed for the GaInP/GaAs emitter-base junction. Double crystal x-ray measurements can be used to verify the lattice match of GaInP to GaAs.

Another technique for growing the structures is to use a modified Metal-organic Molecular Beam Epitaxy (MOMBE) system. Tertiarybutylarsine (TBA) and tertiarybutylphosphine (TBP) along with elemental Ga and In sources can be used for the epitaxy of GaAs and GaInP. The group-V metal alkyl precursors are typically cracked at about 700° C. The substrate temperature is nominally about 520° C. and is lowered to approximately 480° C. during the growth of the GaInP emitter. An approximately 2 minute growth interruption is used for transition between group-V containing materials. The growth rate is typically about 0.8 µm/hr and the III-V ratio is maintained below about 10. C or Be are typically used as the base dopant in this embodiment. Spacer layer 112 helps keep base dopant from diffusing from the highly doped base layer into the emitter. The low growth temperature is also important in limiting dopant diffusion. Si or Sn are typically used as the n-type dopant in GaAs. Sn in particular achieves a high doping level of $1 \times 10^{19}$ cm$^3$, a level not easily attainable by more conventional dopants such as Si. This high doping results in a very low contact resistance. However, Si is more stable, and is the preferred dopant when available.

An important feature of the MOMBE technique used here is that the metalorganic alkyls and pure elemental sources are tyically used for group-V and group-III elements, respectively. Epitaxial layers thus grown exhibit excellent surface morphologies with minimal oval defects (defects that can result when ther are dusters of Ga atoms on the wafer surface). It may be appreciated that the material structure used in the abovementioned embodiments can be grown with the MOMBE procedure described, or with the more conventional and well known techniques such as molecular beam epitaxy and metal-organic chemical vapor deposition as described hereinabove.

Thus, in etching GaAs/GaInP, while it has been found that dry/dry etching is not effective because of difficulties in dry etching GaInP with conventional dry etchants, and that wet/wet etching produces excessive undercutting and does not allow production of very small devices, it has been discovered that such small devices can be made by dry/wet etching if the problem of the residual layer (formed by reaction of the dry etchant with the GaInP) is properly addressed (either by removing or avoiding the residual layer).

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE I

| Element # | Generic Name | Preferred Material | Examples of Alternatives | Approximate Thicknesses |
| --- | --- | --- | --- | --- |
| 62 | Emitter Contact | Ti/Pt/Au | | 300/250/3000Å |

TABLE I-continued

| Element # | Generic Name | Preferred Material | Examples of Alternatives | Approximate Thicknesses |
| --- | --- | --- | --- | --- |
| 64 | Emitter Cap | InGaAs | | 750Å |
| 66 | Buffer | GaAs | GaInP | 2000Å |
| 68 | Emitter | GaInP | | 900Å |
| 70 | Base | GaAs | | 800Å |
| 72 | Collector | GaAs | | 7000Å |
| 74 | Subcollector | GaAs | | 1 μm |
| 76 | Base Contact | Ti/Pt/Au | | 300/250/3000 |
| 78 | Collector Contact | AuGe/Ni/Au | | 500/140/4000Å |

TABLE II

| Element # | Generic Name | Approximate Doping Concentration | Preferred Dopant | Examples of Alternative Dopants |
| --- | --- | --- | --- | --- |
| 64 | Emitter Cap | $1 \times 10^{19}$ cm$^{-3}$ | Si | Sn |
| 66 | Buffer | $2 \times 10^{18}$ cm$^{-3}$ | Si | Sn |
| 68 | Emitter | $5 \times 10^{17}$ cm$^{-3}$ | Si | Sn |
| 70 | Base | $3 \times 10^{19}$ cm$^{-3}$ | C | Be |
| 72 | Collector | $2 \times 10^{16}$ cm$^{-3}$ | Si | Sn |
| 74 | Subcollector | $2 \times 10^{18}$ cm$^{-3}$ | Si | Sn |

TABLE II

| Element # | Generic Name | Preferred Material | Examples of Alternatives | Approximate Thicknesses |
| --- | --- | --- | --- | --- |
| 82 | Emitter Contact | Ti/Pt/Au | | 300/250/3000Å |
| 84 | Emitter Cap | InGaAs | | 750Å |
| 86 | Buffer | GaAs | GaInP | 2000Å |
| 88 | Etch Stop | AlGaAs | | 30Å |
| 90 | Emitter | GaInP | | 900Å |
| 92 | Base | GaAs | | 800Å |
| 94 | Collector | GaAs | | 7000Å |
| 96 | Subcollector | GaAs | | 1 μm |
| 98 | Base Contact | Ti/Pt/Au | | 300/250/3000Å |
| 100 | Collector Contact | AuGe/Ni/Au | | 500/140/4000Å |

TABLE IV

| Element # | Generic Name | Approximate Doping Concentration | Preferred Dopant | Examples of Alternative Dopants |
| --- | --- | --- | --- | --- |
| 84 | Emitter Cap | $1 \times 10^{19}$ cm$^{-3}$ | Si | Sn |
| 86 | Buffer | $2 \times 10^{18}$ cm$^{-3}$ | Si | Sn |
| 88 | Etch Stop | $5 \times 10^{17}$ cm$^{-3}$ | Si | Sn |
| 90 | Emitter | $5 \times 10^{17}$ cm$^{-3}$ | Si | Sn |
| 92 | Base | $3 \times 10^{19}$ cm$^{-3}$ | C | Be |
| 94 | Collector | $2 \times 10^{16}$ cm$^{-3}$ | Si | Sn |
| 96 | Subcollector | $2 \times 10^{18}$ cm$^{-3}$ | Si | Sn |

TABLE V

| Element # | Generic Name | Preferred Material | Examples of Alternatives | Approximate Thicknesses |
| --- | --- | --- | --- | --- |
| 104 | Emitter Contact | Ti/Pt/Au | | 300/250/3000Å |
| 106 | Emitter Cap | GaAs | | 2000Å |
| 108 | Buffer | GaInP | GaAs | 200Å |
| 110 | Emitter | GaInP | | 700Å |
| 112 | Spacer | GaAs | | 100Å |
| 114 | Base | GaAs | | 800Å |
| 115 | Set-back | GaAs | | 200Å |
| 116 | Collector | GaInP | | 7000Å |
| 118 | Subcollector | GaAs | | 1 μm |
| 120 | Base Contact | Ti/Pt/Au | | 300/250/3000Å |
| 122 | Collector Contact | AuGe/Ni/Au | | 500/140/4000Å |

TABLE V-continued

| Element # | Generic Name | Preferred Material | Examples of Alternatives | Approximate Thicknesses |
| --- | --- | --- | --- | --- |
| | | Au | | |

TABLE VI

| Element # | Generic Name | Approximate Doping Concentration | Preferred Dopant | Examples of Alternative Dopants |
| --- | --- | --- | --- | --- |
| 106 | Emitter Cap | $1 \times 10^{19}$ cm$^{-3}$ | Si | Sn |
| 108 | Buffer | $1 \times 10^{18}$ cm$^{-3}$ | Si | Sn |
| 110 | Emitter | $5 \times 10^{17}$ cm$^{-3}$ | Si | Sn |
| 112 | Spacer | $1 \times 10^{18}$ cm$^{-3}$ | Si | Sn |
| 114 | Base | $3 \times 10^{19}$ cm$^{-3}$ | C | Be |
| 115 | Set-back | Undoped | Na | Sn |
| 116 | Collector | $3 \times 10^{16}$ cm$^{-3}$ | Si | Sn |
| 118 | Subcollector | $2 \times 10^{18}$ cm$^{-3}$ | Si | Sn |

What is claimed is:

1. A method for removing portions of successive layers of GaAs and GaInP comprising the steps of:
   performing a reactive ion etch on said GaAs layer; and performing a wet etch on said GaInP layer, whereby a mesa formed as a result of said reactive ion etch and said wet etch has substantially vertical sidewalls, and further whereby GaInP/GaAs structures having dimensions of less than approximately 3.0 μm may be fabricated.

2. The method of claim 1 further comprising the steps of:
   interposing a layer of AlGaAs between said layer of GaAs and said layer of GaInP wherein said reactive ion etch stops of said AlGaAS layer; and
   removing said AlGaAs layer with a wet etch.

3. The method of claim 1 further comprising the steps of:
   stopping said reactive ion etch before said GaInP layer is exposed, wherein a thin layer of GaAs is left above said GaInP layer; and
   etching said thin layer of GaAs with an etch solution containing $H_2O_2$.

4. The method of claim 4 wherein said etch solution also contains an acdd.

5. The method of claim 4 wherein said acid is $H_2SO_4$.

6. The method of claim 3 wherein said etch solution also contains a base.

7. The method of claim 1 wherein wet etch is performed with HCl as an etchant.

8. The method of claim 1 wherein said wet etch is performed with HCl:$H_3PO_4$ (3:1 by volume).

9. The method of claim 1 wherein said GaInP is $Ga_x In_{1-x}P$, wherein x is in the range of approximately 0.48 to 0.53.

10. A method for removing portions of successive layers of GaAs and GaInP comprising the steps of:
    performing a reactive ion etch on said GaAs layer;
    stopping said reactive ion etch at a surface of said GaInP layer, wherein said reaction of a reactant in a plasma used in said reactive ion etching with said GaInP layer forms a residual layer that inhibits etching of said GaInP layer;
    ion milling said residual layer; and
    performing a wet etch on said GaInP layer.

11. The method of claim 10 wherein $CLl_3 + SF_6$ is a reactant in said reactive ion etch.

12. The method of claim 10 further comprising the step of performing a cleanup etch on said GaInP layer with a solution containing HF.

13. A method for forming a heterojunction bipolar transistor comprising the steps of:
   patterning metallization over a material structure to form an emitter contact, said material structure comprising:
      a GaAs emitter cap layer;
      a GaInP emitter layer;
      a base layer;
      a collector layer; and
      a subcollector layer;
   performing a reaction ion etch on said emitter cap layer to remove portions of said material structure not covered by said patterned metallization, wherein $CCl_3 + SF_6$ is a reactant in said reactive ion etch;
   performing a wet etch to remove said GaInP layer from said material structure not covered by said patterned metallization to form an emitter mesa and to expose said base layer;
   forming base contacts on said base layer;
   removing said base layer from an aera surrounding said emitter mesa to form a base mesa;
   removing portions of said collector layer to expose said subcollector layer; and
   forming collector contacts on said subcollector layer.

14. The method of claim 13 further comprising the steps of:
   interposing a layer of AlGaAs between said layer of GaAs and said layer of GaInP wherein said reactive ion etch stops on said AlGaAs layer; and removing said AlGaAs layer with a wet etch.

15. The method of claim 13 further comprising the steps off
   stopping said reactive ion etch before said GaInP layer is exposed. wherein a thin layer of GaAs is left above said GaInP layer; and
   etching said thin layer of GaAs with a solution containing $H_2O_2$.

16. The method of claim 15 wherein said etch solution also contains an acid.

17. The method of claim 16 wherein said acid is $H_2SO_4$.

18. The method of claim 15 wherein said etch solution also contains a base.

19. The method of claim 12 wherein said wet etch is performed with HCl as an etchant.

20. The method of claim 13 wherein said wet etch is performed with $HCl:H_3PO_4$ (3:1 by volume).

21. The method of claim 12 wherein said GaInP is $Ga_xIn_{1-x}$, P, wherein x is in the range of approximately 0.48 to 0.53.

22. A method for forming a heterojunction bipolar transistor comprising the steps of:
   patterning metallization over a material structure to form an emitter contact, said material structure comprising:
      a GaAs emitter cap layer;
      a GaInP emitter layer;
      a base layer;
      a collector layer; and
      a subcollector layer;
   performing a reaction ion etch on said emitter cap layer to remove portions of said material structure not covered by said patterned metallization;
   stopping said reactive ion etch at a surface of said GaInP layer, wherein said reaction of a rectant in a plasma used in said reactive ion etching growth said GaInP layer forms a residual layer that inhibits etching of said GaInP layer;
   ion milling said residual layer; and
   performing a wet etch to remove said GaInP layer from said portions of said material structure not covered by said patterned metallization to form an emitter mesa and to expose said base layer;
   forming base contacts on said base layer;
   removing said base layer from an area surrounding said emitter mesa to form a base mesa;
   removing portions of said collector layer to expose said subcollector layer; and
   forming collector contacts on said subcollector layer.

23. The method of claim 22 wherein $BCl_3 + SF_6$ is a reactant in said reactive ion etch.

24. The method of claim 22 further comprising the step of performing a cleanup etch on said GaInP layer with a solution containing HF.

* * * * *